(12) United States Patent
Esposito (10) Patent No.: US 7,483,420 B1
(45) Date of Patent: Jan. 27, 2009

(54) DSP CIRCUITRY FOR SUPPORTING MULTI-CHANNEL APPLICATIONS BY SELECTIVELY SHIFTING DATA THROUGH REGISTERS

(75) Inventor: Ben Esposito, Oviedo, FL (US)

(73) Assignee: Altera Corporation, San Jose, CA (US)

( * ) Notice: Subject to any disclaimer, the term of this patent is extended or adjusted under 35 U.S.C. 154(b) by 518 days.

(21) Appl. No.: 10/796,499

(22) Filed: Mar. 8, 2004

(51) Int. Cl.
H04L 12/50 (2006.01)
G06C 19/00 (2006.01)
H04B 3/20 (2006.01)

(52) U.S. Cl. .................. 370/371; 377/76; 370/291; 712/35; 708/301

(58) Field of Classification Search .............. 712/35, 712/19; 710/52; 370/371, 291; 708/301; 377/76
See application file for complete search history.

(56) References Cited

U.S. PATENT DOCUMENTS

| | | | | |
|---|---|---|---|---|
| 3,665,396 A | * | 5/1972 | Forney, Jr. ................ 714/789 |
| 3,831,013 A | * | 8/1974 | Alsup et al. ............... 708/425 |
| 4,174,514 A | * | 11/1979 | Sternberg .................. 382/303 |
| 4,271,488 A | * | 6/1981 | Saxe ........................ 365/240 |
| 4,727,424 A | * | 2/1988 | Chao ........................ 348/614 |
| 5,058,183 A | * | 10/1991 | Schmidt et al. ............ 382/209 |
| 5,144,525 A | * | 9/1992 | Saxe et al. ................. 365/45 |
| 5,179,714 A | * | 1/1993 | Graybill ..................... 712/19 |
| 5,193,092 A | * | 3/1993 | Hartoog et al. ............ 714/732 |
| 5,526,301 A | * | 6/1996 | Saxe ......................... 365/45 |
| 5,594,675 A | * | 1/1997 | Peng ......................... 708/313 |
| 6,212,590 B1 | * | 4/2001 | Melo et al. ................. 710/119 |
| 6,279,087 B1 | * | 8/2001 | Melo et al. ................. 711/146 |
| 6,421,251 B1 | * | 7/2002 | Lin ........................... 361/788 |
| 7,353,356 B2 | * | 4/2008 | Shirota ...................... 711/167 |
| 2002/0089348 A1 | * | 7/2002 | Langhammer ............. 326/38 |
| 2002/0130944 A1 | * | 9/2002 | Ema et al. .................. 347/132 |
| 2004/0243743 A1 | * | 12/2004 | Smith ........................ 710/52 |
| 2005/0238117 A1 | * | 10/2005 | Washakowski et al. ...... 375/302 |

* cited by examiner

*Primary Examiner*—Richard Ellis
*Assistant Examiner*—Driss N Alrobaye
(74) *Attorney, Agent, or Firm*—Ropes & Gray LLP (57) ABSTRACT

Digital signaling processing (DSP) circuitry that supports multiple channel or time division multiplexing (TDM) applications is provided. For example, the DSP circuitry can process one or more channels of data without mixing the data of one channel with data of another channel. DSP circuitry of the invention supports multiple channel or TDM applications by embedding a tap delay line structure within the DSP circuitry. Utilizing this embedded tap delay line structure enables the DSP circuitry to support multi-channel or TDM applications independent of any external circuitry such as logic resources, thereby freeing up those resources for other uses.

27 Claims, 6 Drawing Sheets

DSP CIRCUITRY FOR SUPPORTING MULTI-CHANNEL APPLICATIONS BY SELECTIVELY SHIFTING DATA THROUGH REGISTERS

BACKGROUND OF THE INVENTION

This invention relates to digital signal processing ("DSP") circuitry for use in programmable logic devices, and more particularly to DSP circuitry that can process multiple channels of data being transmitted on the same carrier.

Programmable logic devices ("PLDs") are well known for their ability to perform any of a wide range of functions, depending on how they are programmed. Programming may be done by storing data in control bits on the PLD, by custom-configuring one or more layers of the materials used to fabricate the PLD, or by any other suitable means. Depending on the technology employed, the programming may be volatile or non-volatile, one-time-only or reprogrammable, etc.

In addition to the general-purpose circuitry typically included in the architecture of a PLD, it is also known to include various types of special-purpose circuitry in such devices. Examples of such special-purpose circuitry are blocks of memory, microprocessor circuitry, DSP circuitry, etc. Advantages of using special purpose circuitry is that they may be used to perform functions or process data independent of the programmable logic resources of the PLD, thus freeing those resources for other desired functions.

Consider, for example, existing DSP circuitry which can be used to perform common DSP task such as multiplication and filtering functions such as infinite impulse response filtering and finite impulse response filtering. Often times, it is desired that conventional DSP circuitry perform these task on multiple channels of data being carried on a single carrier. Providing multiple channels on a single carrier is known and is sometimes referred to as time division multiplexing ("TDM"). In multi-channel or TDM applications, each channel of data typically takes the form of a pulse modulation signal (e.g., pulse-amplitude modulation, pulse-width modulation, pulse-code modulation, etc.), which can be "interweaved" onto a signal carrier. This carrier signal is then transmitted to some type of circuitry that "unweaves" the multiple channels of data without mixing any of the channels.

When conventional DSP circuitry independently processes multiple channels of data on a single carrier, the channels often become mixed. That is, the data on one channel (e.g., channel 0) may be mixed with the data of another channel (e.g., channel 1), resulting in erroneous data processing. If multiple channels of data need to processed, using such conventional DSP circuitry, the conventional DSP circuitry needs to interact with tap delay lines. As known in the art, tap delay lines include circuitry that registers multiple channels of data and enables DSP circuitry to process each channel of data without experiencing cross-channel mixing.

Using this approach, however, requires that the tap delay lines be implemented using logic resources. Such use of logic resources is inefficient at least because those logic resources are being devoted to a tap delay line when they could better utilized in providing other desired functions.

It would therefore be desirable to provide DSP circuitry that can support multi-channel or time-division-multiplexing applications.

It would also be desirable to support multi-channel applications without requiring any utilization of logic resources.

SUMMARY OF THE INVENTION

It is therefore an object of the invention to provide improved DSP circuitry that supports multiple channel applications.

It is also an object of the invention to provide support multi-channel finite impulse response filter configurations.

These and other objects of the invention are provided by embedding an improved tap delay line structure within DSP circuitry. This improved tap delay line structure enables the DSP circuitry to support multiple channel or TDM applications without having to rely on logic elements or other circuitry external to the DSP circuitry. Thus, by embedding the circuitry of the invention within a DSP block, other circuitry such as logic elements, are free to be used for other desired operations.

The circuitry of the invention may be used in conjunction with a variety of DSP functions. For example, the circuitry of the invention can support multi-channel filter functions such as direct form I and II filter structures. The circuitry of the invention can be used in combination with hybrid multipliers implemented using both DSP circuitry and programmable logic circuitry.

Further features of the invention, its nature and various advantages, will be more apparent from the accompanying drawings and the following detailed description.

DETAILED DESCRIPTION

Figure 1:
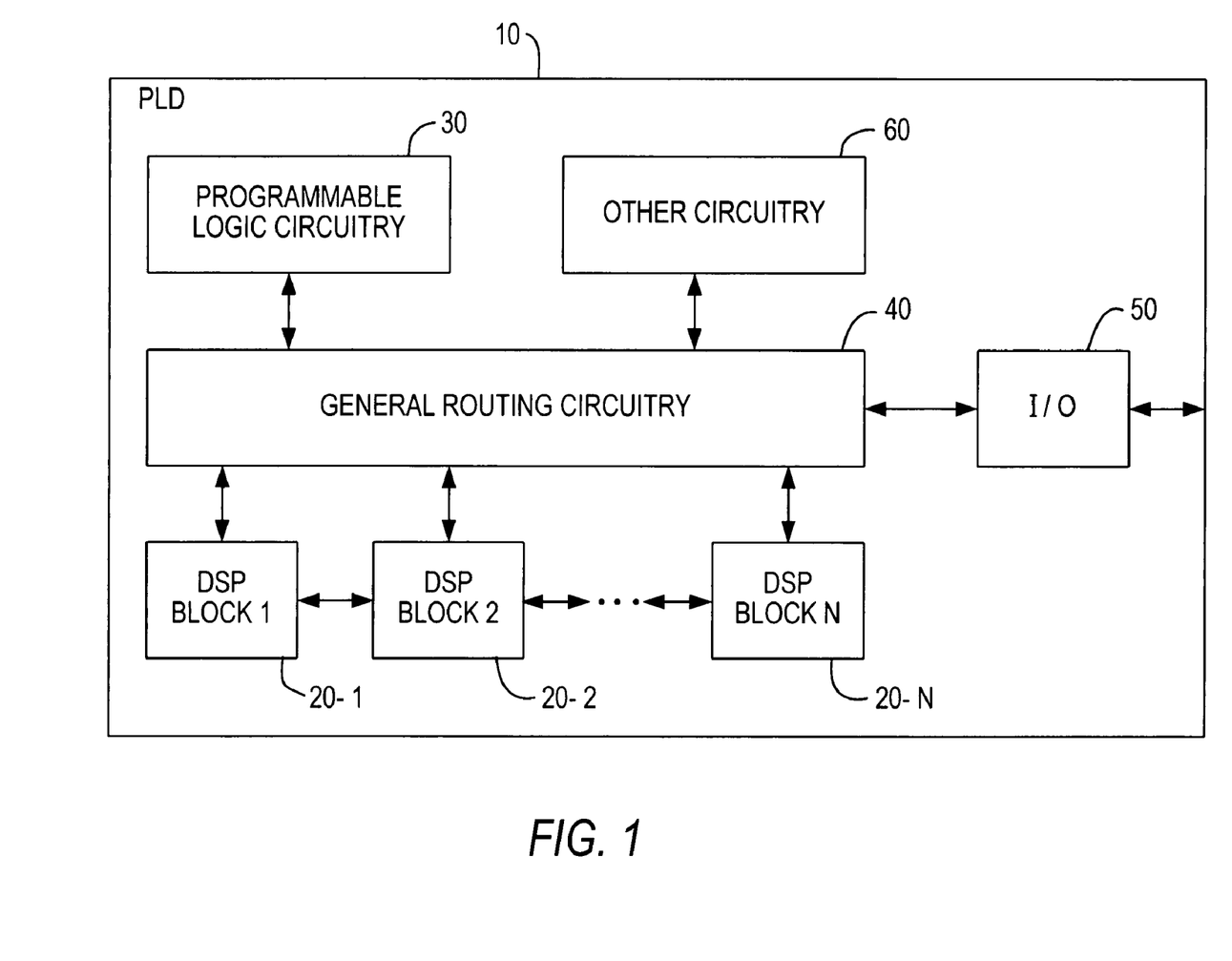
FIG. 1 is a simplified block diagram of an illustrative embodiment of a programmable logic device that can be constructed in accordance with the invention.

An illustrative programmable logic device ("PLD") integrated circuit 10 including digital signal processing ("DSP") blocks 20 in accordance with the invention is shown in FIG. 1. In addition to several DSP blocks 20-1 through 20-N, PLD 10 includes programmable logic circuitry 30, general routing circuitry 40, and I/O circuitry 50. PLD 10 may also include one or more other types of circuitry 60 (e.g., blocks of memory circuitry, microprocessor circuitry, etc.). Programmable logic circuitry 30 is typically programmable to perform any of a wide variety of logic tasks. General routing circuitry 40 is also typically programmable to at least a large degree and is provided to route signals to, from, and/or between other circuitries 20, 30, 50, and 60 (possibly also including between various parts of those other circuitries, such as between various parts of programmable logic circuitry 30). I/O circuitry 50 is provided for making connections between PLD 10 and whatever external circuitry PLD 10 is used with. FIG. 1 also shows that there may be various direct connections between adjacent ones of DSP blocks 20.

Typical of everything that is shown and described herein, FIG. 1 is intended to be illustrative and not limiting. For example, PLD 10 may also include other circuitry and connections that are not shown in FIG. 1, or circuitries or connections shown in FIG. 1 may be omitted if desired. As an example of possible additions to what is shown in FIG. 1, some input signals to PLD 10 may not pass through general routing circuitry 40. Certain high-speed signals (e.g., clock signals) may go directly to the circuit components (e.g., 20, 30, 60, etc.) that need those signals. As another example of possible additions, PLD 10 may include so-called high-speed serial interface ("HSSI") circuitry that is dedicated to converting high-speed serial input signals to a form that is more readily dealt with by the remainder of the circuitry on PLD 10. Such HSSI circuitry may directly receive data signals from external sources without those data signals passing through any general routing circuitry 40. As still another example of a possible addition to what is shown in FIG. 1, other connections between various circuitries on the device may be provided if desired. For example, more direct connections (i.e., not via general routing circuitry 40) may be provided between DSP blocks 20 and programmable logic circuitry 30, between DSP blocks 20 and I/O circuitry 50, and/or between DSP blocks 20 and other circuitry 60.

DSP circuitry 20 may be a medium through which PLD 10 processes certain types of digital signals to achieve suitable operating speeds without substantially impairing or using other resources of PLD 10. DSP circuitry 20 may have capabilities that complement the capabilities of programmable logic circuitry 30. The complementary capabilities may sustain substantially concurrent use of substantially all of programmable logic circuitry 30 and DSP circuitry 20. If desired, DSP circuitry 20 may operate without relying on distributed general routing circuitry 40 for performing internal DSP operations. Thus, DSP circuitry 20 may operate as a high speed isolated DSP channel.

DSP circuitry 20 typically includes register circuitry, DSP utilization circuitry, interconnection circuitry, and other DSP circuitry. Register circuitry may used to register data, which may be received from data sources (external to DSP circuitry 20) or from registers (within DSP circuitry 20). Data may be provided directly to DSP utilization circuitry by the data sources or register circuitry. DSP utilization circuitry may include, but not limited to, multiplier circuits, adder circuits, subtractor circuitry, and accumulator circuits. Interconnection circuitry may include connecting conductors and circuitry that interconnect the various circuitry (e.g., register circuitry and DSP utilization circuitry) of DSP circuitry 20. The interconnections may be programmable or dedicated. Interconnection circuitry can also include multiplexer circuits that can select which inputs signals are propagated to other circuitry.

The above-discussion of DSP circuitry 20 is illustrative of the content and organization of a single DSP circuit block. The various circuitry enables DSP circuitry 20 to perform a number of commonly used DSP operations such as infinite impulse response ("IIR") filters, direct form I finite impulse response ("FIR") filters, direct form II FIR filters, multiply accumulate operations, or any other suitable DSP operations.

A more detailed discussion of the structure of a PLD having integrated DSP circuitry is found in commonly-assigned Langhammer et al. U.S. Pat. No. 6,538,470, which is hereby incorporated by reference herein in its entirety.

It will be understood that the foregoing description of a structure of a PLD having integrated DSP circuitry is merely illustrative. The present invention may be practiced with respect to any other suitable PLD structure having integrated DSP circuitry. The present invention may, in fact, be practiced with a PLD coupled to external DSP circuitry. For purposes of clarity and brevity, the present invention is described herein in terms of a PLD having integrated DSP circuitry.

The present invention is described herein primarily in terms of embedded tap delay line circuitry that enables DSP circuitry 20 to support multi-channel or TDM applications. DSP circuitry 20 supports multi-channel or TDM applications by using a tap delay line circuit arrangement illustrated in FIG. 2. The circuit arrangement in FIG. 2 is an example of one specific configuration and it is understood that like other features shown and described herein, FIG. 2 is intended to be illustrative and not limiting.

Figure 2:
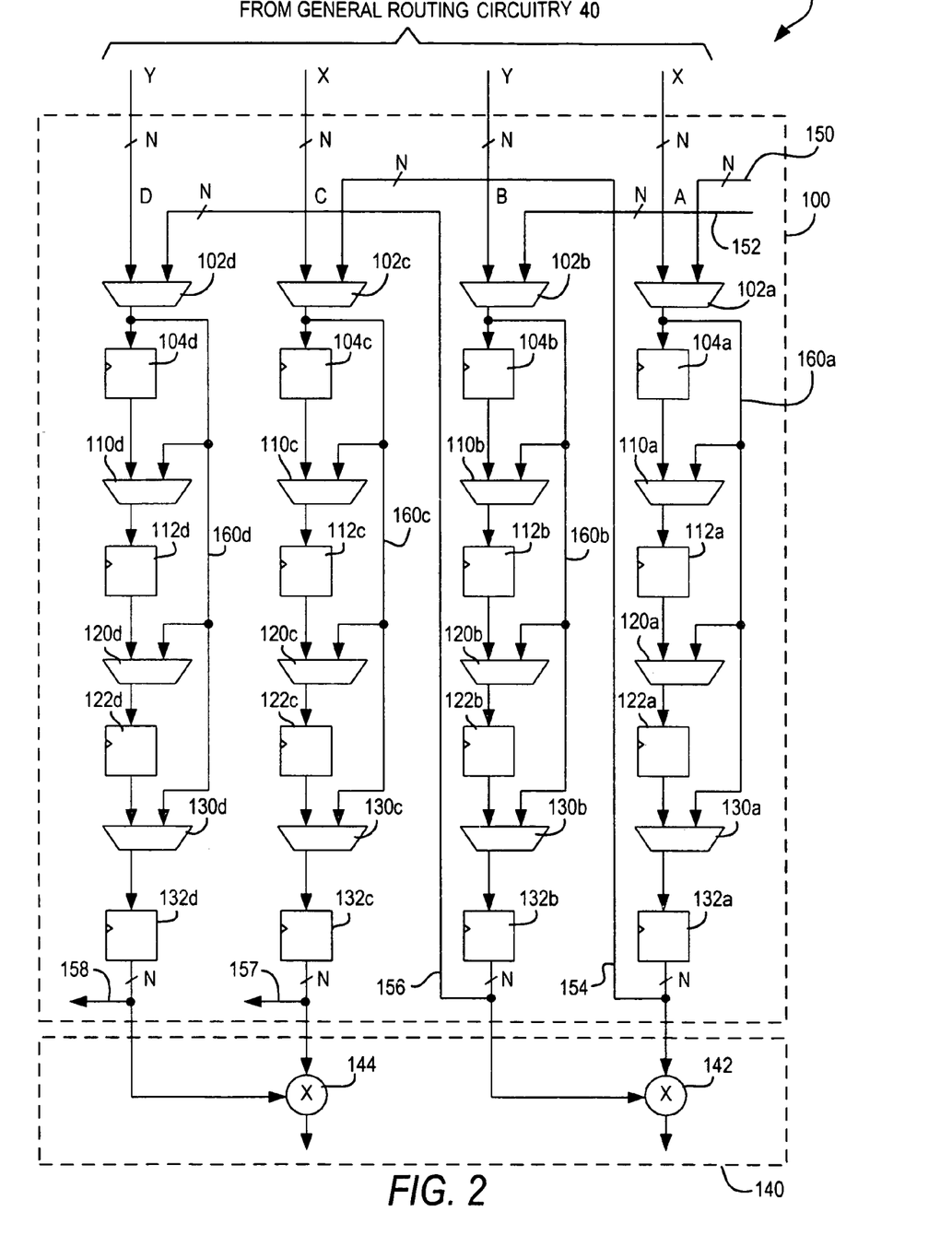
FIG. 2 is a simplified schematic diagram of DSP circuitry that can be constructed in accordance with the invention.

For convenience, the circuitry of the invention that enables DSP circuitry 20 to process multiple channels of data is herein referred to as circuitry 100 (which is outlined by dashed lines in FIG. 2). Circuitry 100 may receive multiple channels of data, register the data to preserve channel integrity (i.e., prevent channels from mixing), and provide data of the appropriate channel to DSP utilization circuitry 140.

Circuitry 100 may receive data being transmitted, for example, on general routing circuitry 40 or from any other suitable routing circuitry such as direct routing circuitry (not shown).

Figure 4:
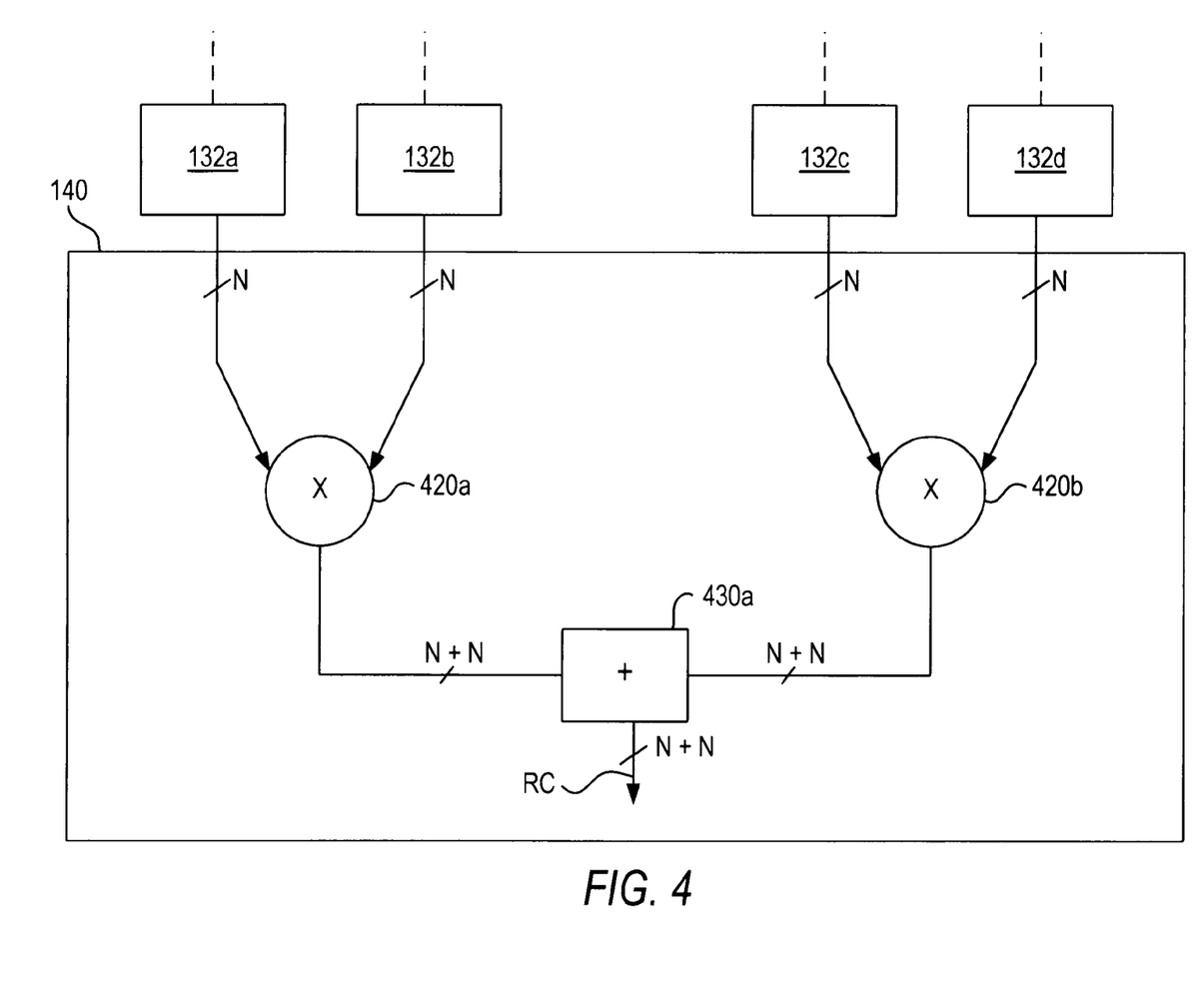
FIG. 4 shows an illustrative use or configuration of a DSP block in accordance with the invention.

DSP utilization circuitry 140 includes circuitry (e.g., multiplier circuits, adder circuits, etc.) to operate on the data provided by circuitry 100. DSP utilization circuitry 140 is typically responsible for enabling DSP circuitry 20 to perform a desired DSP operation. For example, circuitry 140 may be constructed or be configurable to perform arithmetic operations of integers, real numbers, and imaginary numbers of various length (e.g., 9 bit, 18 bit, or 27 bit arithmetic). Circuitry 140 may enable DSP circuitry 20 to perform the operations needed to provide a FIR filter (e.g., a symmetrical, even order, or odd-order FIR filter). The complexity of DSP utilization circuitry 140 can range from simple circuitry such as multipliers to more complex circuitry such as hybrid multipliers. Examples of hybrid multipliers can be found, for example, in Esposito et al., U.S. patent application Ser. No. 10/712,500, filed, Nov. 12, 2003, the disclosure of which is incorporated in its entirety. Examples of other types of DSP utilization circuitry can found in Langhammer et al., U.S. patent application Ser. No. 10/678,201, filed Oct. 3, 2003, the disclosure of which is incorporated in its entirety. (FIG. 4 shows a schematic diagram of an embodiment of DSP utilization circuitry 140 that can be used to provide DSP circuitry 20 with FIR filtering operations.)

For brevity and clarity, DSP utilization circuitry 140, as shown in FIG. 2, includes multiplier circuits 142 and 144. Multiplier circuits 142 and 144 function as taps because these two circuits receive the data from circuitry 100. Thus, by convention, the circuitry arrangement shown in FIG. 2 is a two tap circuit.

As shown, circuitry 100 includes four columns of registers, two of which feed data to multiplier circuit 142 and the other two of which feed data to multiplier circuit 144. The columns, which are labeled as A, B, C, and D, each include an array of registers arranged in serial. Each register may operate according the same clock signal (not shown, but each register shows a clock signal input). In accordance with this invention, the number of registers in each column may dictate the number of channels that can be handled by DSP circuitry 20. Four registers are shown in the columns of circuitry 100, therefore DSP circuitry 20 can handle one to four channels. These registers are labeled according to the column in which they reside. As shown, column A includes registers 104a, 112a, 122a, and 132a, column B includes registers 104b, 112b, 122b, and 132b, and so forth for columns C and D. For convention, registers 104a-d may be referred to as leading registers and registers 132a-d may be referred to as trailing registers (the labeling of which is based on the registers' relative positions in the column of registers).

It is noted that the number of columns implemented in circuitry 100 is not limited to four. Any suitable number of columns may be included within circuitry 100. For example, the number of columns may be a function of the physical size of DSP circuitry 20, the number of taps being implemented, or any other suitable factor.

It is noted that the number of registers included in circuitry 100 is not limited to the number of registers shown in FIG. 2. In order for the circuitry of the invention to provide multi-channel support, circuitry 100 should include at least 2 registers. Including at least two registers ensures that DSP circuitry 20 can correctly process at least two channels of data. Any suitable number of registers may be included each column.

Circuitry 100 also shows that each column has four multiplexer circuits. Each multiplexer circuit is associated with a register and is operative to selectively output one of at least two input signals to the associated registers. Selection of which inputs are transmitted to the associated register may be performed by control circuitry (not shown). The multiplier circuits, like the registers, are labeled according to the column in which they reside. As shown, column A includes multiplexer circuits 102a, 110a, 120a, and 130a, and column B includes multiplexer circuits 102b, 110b, 120b, and 130b, and so forth for columns C and D.

As will be explained in more detail below, multiplexer circuits 110a-d, 120a-d, and 130a-d may be part of bypass circuitry that can be used to selectively route data past certain ones of registers 104a-d, 112a-d, and 122a-d using bypass lead lines 160a-d. Use of tap delay lines 150, 152, 154, 156, 157, and 158 will also be discussed in more detail below. Note that the multiplexer circuits, tap delay lines, and bypass lead lines may collectively be considered as interconnection circuitry.

Beginning at the top of FIG. 2, circuitry 100 receives data X and Y from, for example, general routing circuitry. Data X and Y may carry N bits of data in parallel, where N represents the width of the bus. Data X and Y are shown being provided to two separate columns in circuitry 100. That is, data X is provided to multiplexer circuits 102a and 102c, whereas data Y is provided to multiplexer circuits 102b and 102d.

Multiplexer circuits 102a-d may also receive a second data input. This second data input may be provided by a data source external to circuitry 20 (e.g., another DSP block) or from a data source within DSP block 20 (e.g., the output of a register in a different column). For example, multiplexer circuits 102a and 102b may each receive a second data input from the output of registers residing in an adjacent DSP block via tap delay lines 150 and 152. Multiplexer circuit 102c may receive data from the output of register 132a via a tap delay line 154 and multiplexer circuit 102d may receive data from the output of register 132b via tap delay line 156.

Multiplexers 102a-d, are controlled by one or more mode control signals (not shown) to select which input signal is to be passed to their respective registers. Thus, by way of example, multiplexer circuitry 102c can select either data X or the output of register 132b. If multiplexer circuitry 102c selects the data output of register 132b, then circuitry 100 utilizes tap delay line 154.

An advantage of this invention is that the tap delay lines are embedded within DSP circuitry 20, as opposed to DSP circuitry that utilizes tap delay lines being implemented with logic resources external to the DSP circuitry. Tap delay lines of this invention route output signals of the trailing register (e.g., registers 132a-d) of one column to the input of a multiplexer circuit (e.g., multiplexer circuits 102a-d) in a different column. By way of example, the output of register 132a is provided to multiplexer circuit 102c and the output of register 132b is provided to multiplexer circuitry 102d. Note that in order to provide a finite impulse response system, the tap delay lines should provide the signals being provided to a tap (e.g., multiplier circuit 142) associated with one or more columns (e.g., a first group) to one or more adjacent columns (e.g., a second group that is adjacent to the first group) that are associated with a different tap (e.g., multiplier circuit 144). By routing the trailing register outputs in this manner, DSP circuitry 20 can support multi-channel FIR applications.

Figure 3:
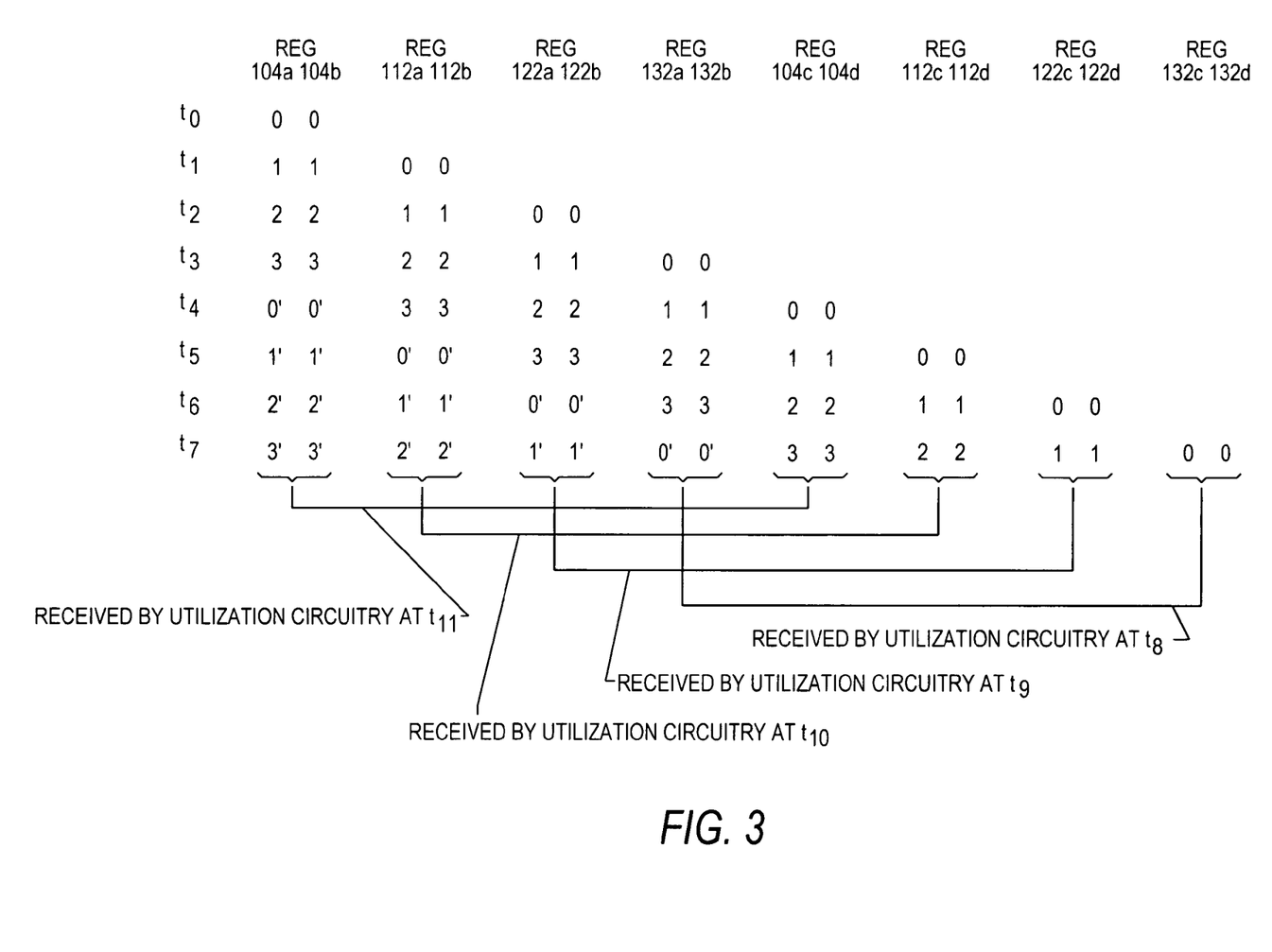
FIG. 3 shows a table that illustrates how circuitry of the invention does not mix channels as the data is processed in accordance with the invention.

To illustrate how the invention can be used in multi-channel or TDM applications consider FIGS. 2 and 3 in conjunction with each other. Assume that the multiplexer circuit mode controls are set to support four channels or a TDM factor of four. Although the bypass functionality of multiplexer circuits 110a-d, 120a-d, and 130a-d has not been discussed in detail, assume that these multiplexer circuits are not being instructed to bypass any registers. Further assume that multiplexer circuit 102c selectively provides the output of register 132a to register 104c and that multiplexer circuit 102d selectively provides the output of register 132b to register 104d. Further yet assume that that DSP utilization circuitry 140 is configured to operate as a FIR filter. Based on the above-assumed configuration, the channel of the data being registered out of registers 132a-d is the same. That is, if registers 102a-b are providing channel 2 data to DSP utilization circuitry 140 (e.g., multiplier circuit 142), registers 102c-d are also providing channel 2 data to DSP utilization circuitry 140 (e.g., multiplier circuit 144).

FIG. 3 shows which channel (e.g., channel 0-3) is stored in registers 104a-d, 112-a-d, 122a-d, and 132a-d for a given clock cycle. As shown, time steps $t_0$-$t_7$ are placed on the y-axis and the registers are placed on the x-axis. Starting with time step to, data on channel 0 is stored in registers 104a and 104b. Then at time step $t_1$, the data on channel 0 is shifted to registers 112a and 112b, and data on channel 1 is shifted into registers 104a and 104b. As shown, the shifting of data continues each time step. At time step $t_3$, all four channels are registered into circuitry 100. Then at time step $t_4$, the channel 0 data of registers 132a and 132b is shifted to registers 104c and 104d by way of tap delay lines 154 and 156 and new channel 0 (denoted by 0') data is registered into registers 104a and 104b. Continuing down to time step $t_7$, all sixteen registers of circuitry 100 have data stored therein.

Note the alignment of the channels as the data is stored in the registers. As shown, channel 0 data is stored in registers 132a-d, channel 1 data is stored in registers 122a-d, and so on. Thus at time step $t_8$ (not shown) the channel 0 data that was stored in registers 132a-d at time step $t_7$ is processed by DSP utilization circuitry 140. Accordingly, in each successive time step, the same channel data is processed by DSP utilization circuitry 140 without the channels being mixed. For example, channel 0 data is not multiplied to channel 2 data.

Referring back to FIG. 2, note that the output of multiplexer circuits 102a-d, 110a-d, 120a-d, and 130a-d are fed directly to their respective registers. Further note bypass leads 160a-d, which route the outputs of multiplexer circuits 102a-d to multiplexer circuits 110a-d, 120a-d, and 130a-d. The combination of bypass leads 160a-d and multiplexer circuits 110a-d, 120a-d, and 130a-d advantageously provides circuitry 100 with programmable flexibility in selecting the number of channels or the TDM factor implemented by DSP circuitry 20. For example, if only two channels are needed, the data outputs of multiplexer circuits 102a-d may bypass registers 104a-d and 112a-d and be fed directly to registers 122a-d via bypass leads 160a-d. This way, two registers (e.g., registers 122a-d and 132a-d) are operative in each column to support both channels.

However, if data signals are not bypassing a register, the multiplexer circuits select the output of the preceding register and provide that output to that multiplexer circuit's associated register. For example, if four channels are being processed by circuitry 100, multiplexer circuits 110a-d selectively route the output signal if registers 104a-d to registers 112a-d; multiplexer circuits 120a-d selectively route the output signal if registers 110a-d to registers 122a-d; and multiplexer circuits 130a-d selectively route the output signal if registers 122a-d to registers 132a-d.

If desired, the bypass programmability of circuitry 100 may be omitted altogether. For example, if the number channels being used is known, circuitry 100 can be constructed with the requisite number of registers to support the desired number of channels. Doing this may eliminate the need for multiplexers 110a-d, 120a-d, and 130a-d.

Two or more DSP blocks 20 may be interconnected together to facilitate building of longer (i.e., more taps) FIR filters. The combination of DSP blocks 20 may be needed when the required number of columns exceeds the capacity of just one DSP block 20. For example, such expansion is apparent when multiplixor circuits 102a and 102b receive tap delay line inputs from trailing registers of an adjacent DSP block 20.

FIG. 4 shows multiplier/adder circuitry 140 that can be used with circuitry 100 of DSP block 20 to perform the operations needed to provide a two tap FIR filter operating on n-bit data samples, where n is the width of the data being processed by circuitry 100. Successive n-bit samples are shifted successively through registers 104a-d, 112a-d, 122a-d, and 132a-d in synchronism with a clock signal applied to all of those registers. In accordance with this invention, the data being shifted out of registers 132a-d correspond to the same channel, as illustrated above in connection with FIG. 3.

Continuing with FIG. 4, multiplier 420a is used to multiply the outputs of registers 132a and 132b. Multiplier 420b is used to multiply the outputs of registers 132c and 132d. Adder 430 is used to add the outputs of multipliers 420a and 420b. Outputs RC are the FIR filter outputs.

Figure 5:
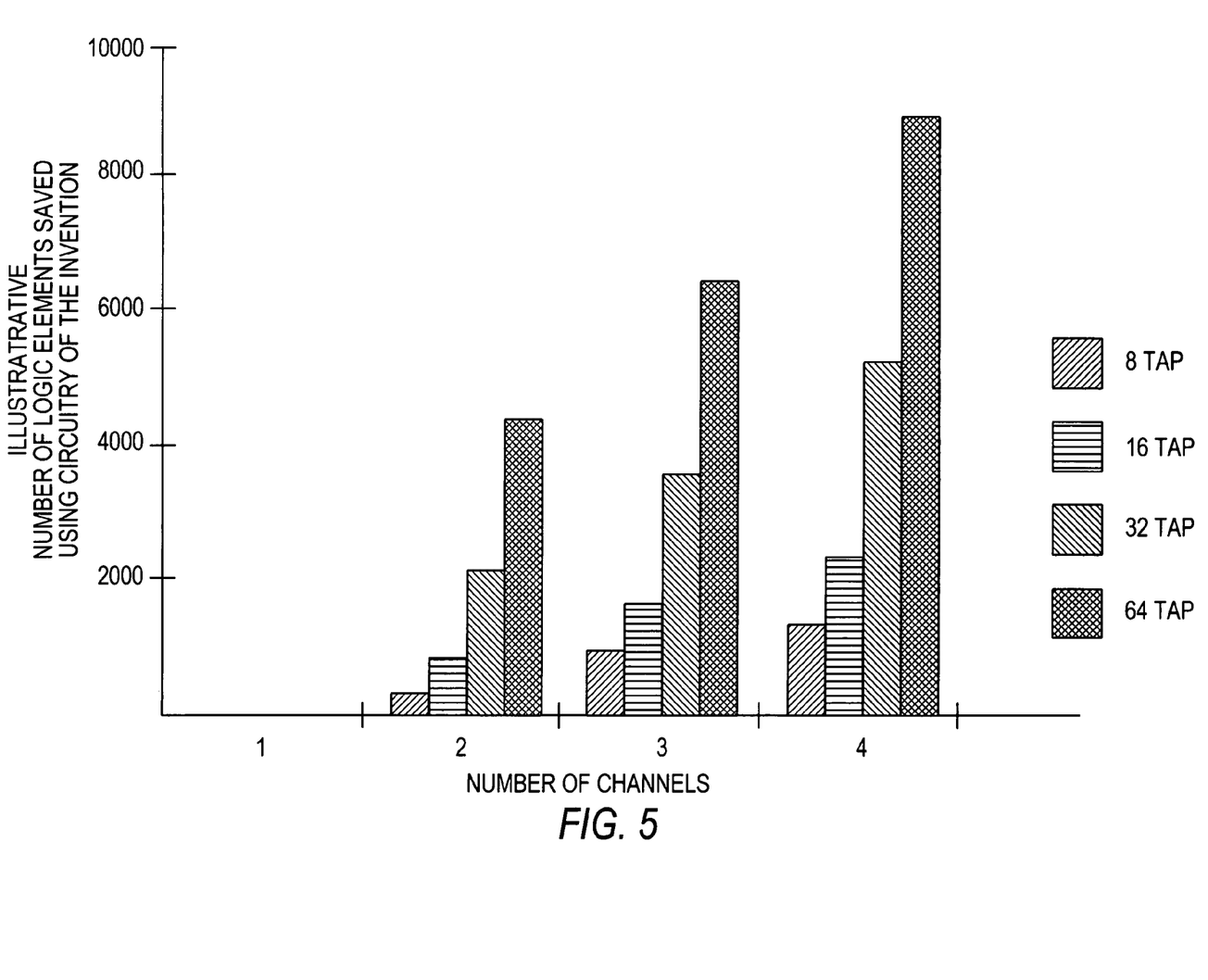
FIG. 5 shows a bar graph illustrating savings in logic resources that can be realized using circuitry in accordance with the invention.

One advantage of the circuitry of the invention is that it eliminates the need to use logic resources to support multi-channel or TDM applications. Thus, the circuitry of the invention frees up the logic elements that would have been used to support multi-channel or TDM applications for other suitable uses. FIG. 5 shows a graph that illustrates logic element savings that may be realized using the circuitry of the invention. As shown in FIG. 5, the logic element savings are shown as a function of tap size (e.g., 8, 16, 22, and 64 tap) and number of channels (e.g., two, three and four channels). It will be understood that the values shown in FIG. 5 are merely illustrative.

Figure 6:
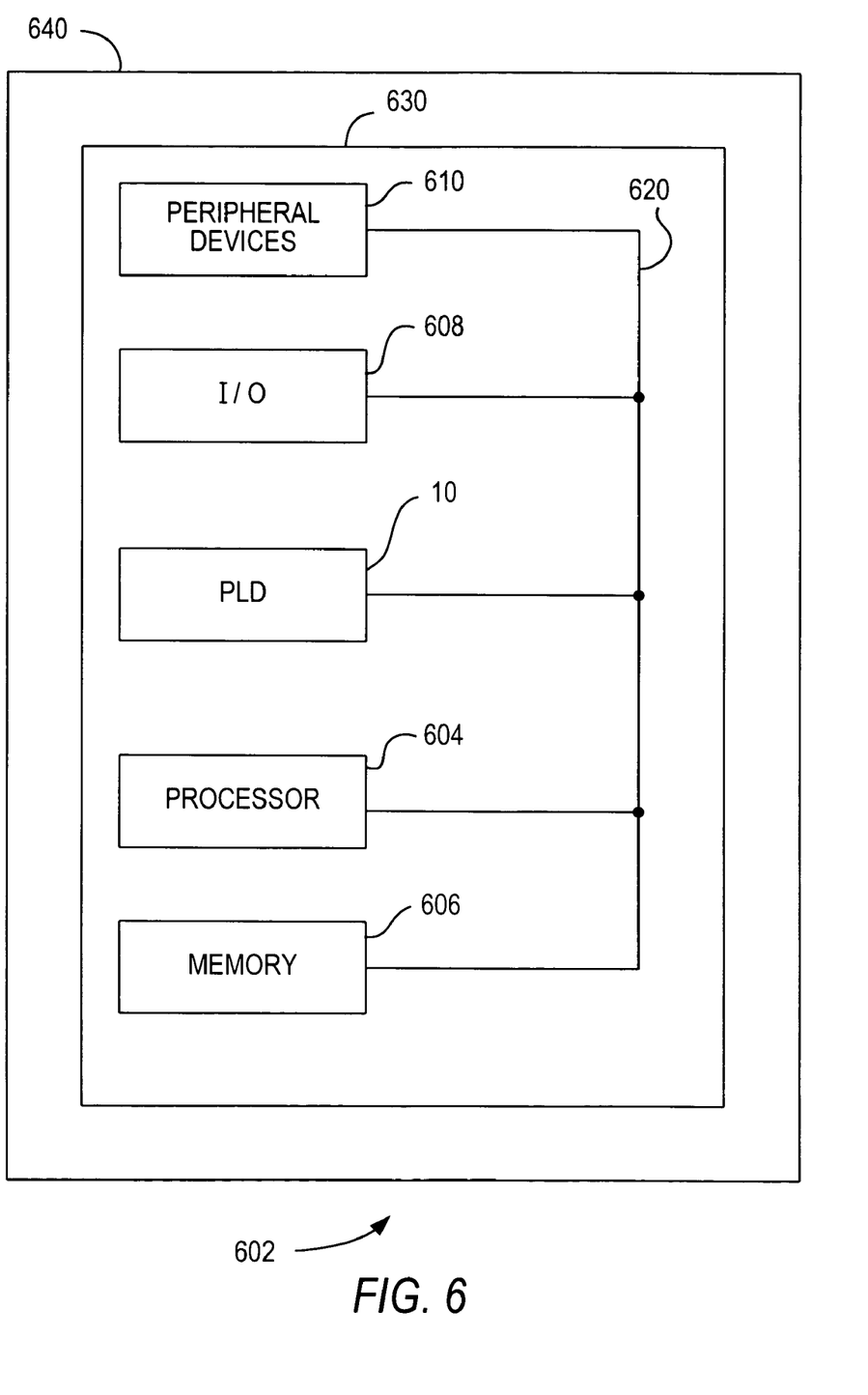
FIG. 6 is a simplified schematic block diagram of an illustrative system employing a programmable logic device in accordance with the invention.

FIG. 6 illustrates a programmable logic device 10 of this invention in a data processing system 602. Data processing system 602 may include one or more of the following components: a processor 604; memory 606; I/O circuitry 608; and peripheral devices 610. These components are coupled together by a system bus 620 and are populated on a circuit board 630 (e.g., a printed circuit board), which is contained in an end-user system 640.

System 602 can be used in any of a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 604. Programmable logic device 10 may also be used as an arbiter for arbitrating access to a shared resource in system 602. In yet another example, programmable logic device 10 can be configured as an interface between processor 604 and one of the other components in system 602. It should be noted that system 602 is only exemplary, and that the true scope and spirit of the invention should be indicated by the following claims.

Various technologies can be used to implement programmable logic devices 10 in accordance with this invention, as well as the various components of those devices (e.g., the logic connectors (such as the depicted multiplexers) used to make connections throughout PLD 10, and the elements that control those logic connectors (the logic connectors being sometimes called "PLCs" and the control elements being called "FCEs")). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, any number of DSP blocks 20 can be included in PLD 10. The particular operating modes shown and described herein are only illustrative, and many other operating modes are also possible. It will also be understood that the circuitry of the invention could have been described as being arranged in rows as opposed to columns.

What is claimed is:

1. Digital signal processing (DSP) circuitry that independently processes a plurality of multi-channel data signals, comprising:

a plurality of columns of registers, each said column comprising a single input, an output and a plurality of registers arranged in serial as a sequence of registers, wherein the single input is coupled to a register of the plurality of registers that is positioned first in the sequence of registers; and interconnection circuitry for allowing a first channel of said plurality of multi-channel data signals to be selectively shifted, at the same time, through said plurality of registers in a first and a second of said columns, wherein said interconnection circuitry:

allows a value at the single input of each column to be selectively routed to any said register in said respective column by bypassing any register or registers that precede said register in said respective column, and allows the output of the first column to be selectively shifted through said plurality of registers in the second column instead of the first channel that is received by the first and second columns at the same time.

2. The circuitry of claim 1, further comprising utilization circuitry for operating on a first piece of data output by a register in the first of said columns and a second piece of data output by a register in the second of said columns, wherein the first and second pieces of data each corresponds to the first channel of the plurality of multi-channel data signals.

3. The circuitry of claim 2, wherein said utilization circuitry comprises circuitry selected from the group consisting of adder circuitries, multiplier circuitries, and a combination thereof.

4. The circuitry of claim 1, wherein the interconnection circuitry comprises:

a multiplexer circuit associated with each register in each said column.

5. The circuitry of claim 1, wherein said interconnection circuitry allows successive data signals to be shifted to as many different said plurality of columns as needed such that the output of each of those columns is used as an input to a finite impulse response filter function.

6. The circuitry of claim 5, wherein a respective register in each of those columns provides a respective piece of the output data used as the input to the filter function, wherein each respective piece of the output data corresponds to the first channel of the plurality of multi-channel data signals.

7. The circuitry of claim 1, wherein said interconnection circuitry can selectively route data signals past one or more of said registers in each said column.

8. The circuitry of claim 1 wherein said circuitry is mounted on a programmable logic device.

9. The programmable logic device defined in claim 8 further comprising:

routing circuitry for selectively supplying signals to and receiving signals from the DSP circuitry.

10. The programmable logic device defined in claim 9 further comprising:

programmable logic circuitry connected to the routing circuitry.

11. A digital processing system comprising:
processing circuitry;
a memory coupled to the processing circuitry; and
a programmable logic device as defined in claim 8 coupled to the processing circuitry and the memory.

12. The circuitry of claim 8 wherein said circuitry is mounted on a printed circuit board.

13. The printed circuit board defined in claim 12 further comprising:

a memory mounted on the printed circuit board and coupled to the programmable logic device.

14. The printed circuit board defined in claim 12 further comprising:

processing circuitry mounted on the printed circuit board and coupled to the programmable logic device.

15. A programmable logic device (PLD), comprising:
digital signal processing (DSP) circuitry that supports multiple channels of data being transmitted on the same carrier, said DSP circuitry comprising:

tap delay line circuitry that comprises:

first and second columns of registers for selectively registering, at the same time, the same data of a first of the multiple channels such that the data of each channel is not mixed with the data of any other channel, wherein the registers are arranged in serial as a sequence of registers, a single input coupled to a register of the plurality of registers that is positioned first in the sequence of registers; and interconnection circuitry that:

allows a value received at the single input to be selectively routed to any register of said registers in said tap delay line circuitry by bypassing any register or registers that precede said register in said tap delay line circuitry, and allows an output of the first column to be selectively registered in said plurality of registers in the second column instead of the data of the first channel that is received by the first and second columns at the same time; and utilization circuitry that performs a function on data received from said tap delay line circuitry.

16. The PLD of claim 15, wherein said tap delay line circuitry further comprises:

a multiplexer circuit respectively associated with a register of each said column, said multiplexer circuit operative to select one of at least two input signals being applied to said multiplexer circuit for application to said associated register, one of said input signals being one of said plurality of multi-channel signals, and another one of said input signals being the output signal of a register that is conveyed by a tap delay line from a register in a column different than the column said multiplexer circuit applies said input signal to.

17. The DSP circuitry of claim 16, wherein said associated register is a leading register in each said column.

18. The DSP circuitry of claim 16, wherein the output signal of the register being conveyed by the tap delay line is the output of a trailing register in each said column.

19. The DSP circuitry of claim 16, wherein the tap delay line conveys an output signal of a register that is being provided to a first tap to a multiplexer circuit associated with a column that provides an output signal to a second tap.

20. The DSP circuitry of claim 15, wherein said utilization circuitry selectively operates on signals output by a register in each said column.

21. The DSP circuitry of claim 16, further comprising bypass circuitry for enabling the selected input signal to be routed directly to any one of said registers in said column of registers.

22. The circuitry of claim 1, wherein the interconnection circuitry comprises:

a first multiplexer circuit associated with a first register in the first of said columns; and a second multiplexer circuit associated with a second register in the first column;

wherein each of the first and second multiplexer circuits is operative to select between a same first value and a different second value for application to the respective first and second registers, wherein the same first value is the value at the input of the first column and the different second value is an output from a register that precedes the first and second registers respectively in the first column.

23. The circuitry of claim 22, wherein the first and second multiplexer circuits each comprises a respective first and a respective second input, wherein:
   the respective first inputs of the first and second multiplexer circuits are coupled to each other and to the input of the first column; and
   the register that precedes the second register in the first column is the first register wherein the second input of the second multiplexer is coupled to the output of the first register.

24. The PLD of claim 15, wherein the interconnection circuitry comprises:
   a first multiplexer circuit associated with a first register of said registers in said tap delay line circuitry; and
   a second multiplexer circuit associated with a second register of said registers in said tap delay line circuitry;
   wherein each of the first and second multiplexer circuits is operative to select between a same first value and a different second value for application to the respective first and second registers, wherein the same first value is the value received at the input of the tap delay line circuitry and the different second value is an output from a register that precedes the respective first and second registers in the tap delay line circuitry.

25. The PLD of claim 24, wherein the first and second multiplexer circuits each comprises a respective first and a respective second input, wherein:
   the respective first inputs of the first and second multiplexer circuits are coupled to each other and to the input of the tap delay line circuitry; and
   the register that precedes the second register in the tap delay line circuitry is the first register wherein the second input of the second multiplexer is coupled to the output of the first register.

26. The circuitry of claim 1, wherein the interconnection circuitry:
   allows a second channel of said plurality of multi-channel data signals to be selectively shifted, at the same time, through said plurality of registers in a third and a fourth of said columns; and
   allows the output of the third column to be selectively shifted through said plurality of registers in the fourth column instead of the second channel that is received by the third and fourth columns at the same time.

27. The circuitry of claim 15, wherein the tap delay line circuitry further comprises:
   third and fourth columns of registers for selectively registering, at the same time, the same data of a second of the multiple channels; and
   wherein the interconnection circuitry allows an output of the third column to be selectively registered in said plurality of registers in the fourth column instead of the data of the second channel that is received by the third and fourth columns at the same time.

* * * * *